(12) United States Patent
Itakura et al.

(10) Patent No.: US 9,854,689 B2
(45) Date of Patent: Dec. 26, 2017

(54) DISPLAY DEVICE

(71) Applicant: Japan Display Inc., Tokyo (JP)

(72) Inventors: Shimon Itakura, Tokyo (JP); Yasuhiro Kobayashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/346,136

(22) Filed: Nov. 8, 2016

(65) Prior Publication Data

US 2017/0164486 A1    Jun. 8, 2017

(30) Foreign Application Priority Data

Dec. 7, 2015  (JP) .................................. 2015-238380

(51) Int. Cl.
| G02F 1/1333 | (2006.01) |
| H05K 5/00 | (2006.01) |
| H05K 1/18 | (2006.01) |
| H05K 5/02 | (2006.01) |

(52) U.S. Cl.
CPC ........... H05K 5/0017 (2013.01); H05K 1/181 (2013.01); H05K 5/0247 (2013.01); H05K 2201/10128 (2013.01)

(58) Field of Classification Search
CPC .... H05K 5/0017; H05K 1/181; H05K 5/0247; H05K 2201/10128
See application file for complete search history.

(56) References Cited

U.S. PATENT DOCUMENTS

| 2012/0194491 A1* | 8/2012 | Ryuh ................... G02F 1/13452 345/206 |
| 2012/0250276 A1* | 10/2012 | Nakajima ............. G06F 1/1626 361/752 |
| 2013/0003339 A1* | 1/2013 | Chen ...................... A47B 81/06 361/807 |
| 2014/0204275 A1* | 7/2014 | Shimizu ............ G02F 1/133611 348/725 |
| 2014/0320747 A1* | 10/2014 | Kamada ............... G02B 6/0085 348/725 |

FOREIGN PATENT DOCUMENTS

JP    H11-38395 A    2/1999

* cited by examiner

*Primary Examiner* — Sherman Ng
(74) *Attorney, Agent, or Firm* — K&L Gates LLP

(57) ABSTRACT

A display device according to an aspect of the present invention includes: a display body including a curved part; a case including a bottom plate part through which a through hole is provided at a position opposed to the curved part; and a printed circuit board that is fixed to a surface of the bottom plate opposite to the display body side with the electronic component is mounted on a surface opposed to the bottom plate and with the electronic component arranged inside the through hole.

5 Claims, 4 Drawing Sheets

DISPLAY DEVICE

CROSS-REFERENCE TO RELATED APPLICATIONS

This application claims priority from Japanese Application No. 2015-238380, filed on Dec. 7, 2015, the contents of which are incorporated by reference herein in its entirety.

BACKGROUND

1. Technical Field

The present invention relates to a display device.

2. Description of the Related Art

There is known a display device formed by curving a display body (for example, refer to Japanese Patent Application Laid-open Publication No. 11-38395). Such a kind of display device is called a curved screen display. A printed circuit board is electrically coupled to the display body. The printed circuit board is drawn to the outside of a case that houses the display body, and fixed to a bottom plate part of the case.

The thickness of the display device is determined by the depth of the case, the thickness of the printed circuit board, and the height of an electronic component mounted on the printed circuit board. In the display device described above, the display body is put into a curved state when being housed in the case. Thus, the depth of the case and the thickness of the display device are increased.

SUMMARY

A display device according to an aspect of the present invention includes: a display body including a curved part; a case including a bottom plate part through which a through hole is provided at a position opposed to the curved part; and a printed circuit board that is fixed to a surface of the bottom plate part opposite to the display body side with an electronic component mounted on a surface of the printed circuit board opposed to the bottom plate part and with the electronic component arranged inside the through hole.

DETAILED DESCRIPTION

Figure 1:
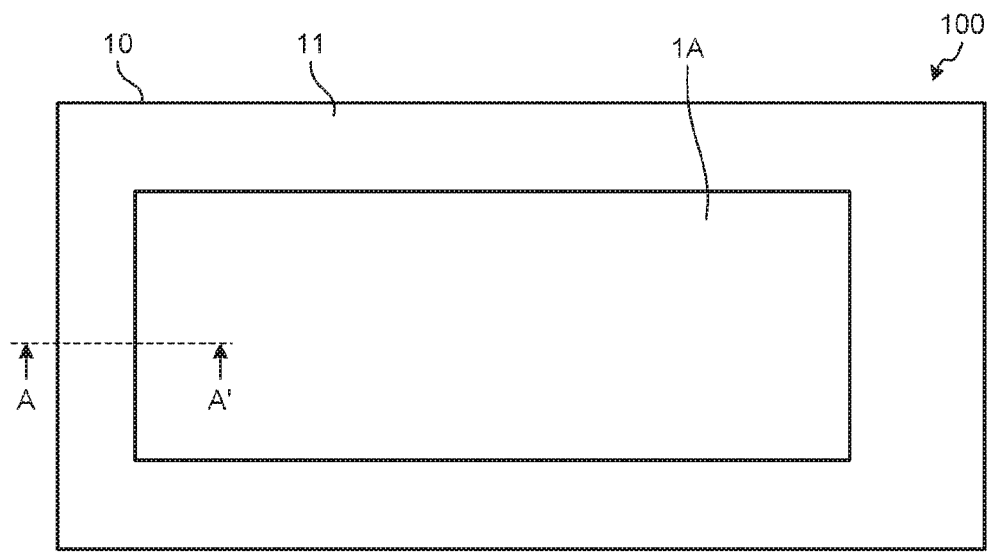
FIG. 1 is a plan view of a display device according to an embodiment viewed from an upper surface side thereof.

The following describes a mode for carrying out the invention (embodiment) in detail with reference to the drawings. The present invention is not limited to the embodiment described below. Components described below include a component that is easily conceivable by those skilled in the art and components that are substantially the same. The components described below can be appropriately combined. The disclosure is merely an example, and the present invention naturally encompasses an appropriate modification maintaining the gist of the invention that is easily conceivable by those skilled in the art. To further clarify the description, the width, the thickness, the shape, and the like of each component may be schematically illustrated in the drawings as compared with an actual aspect. However, the drawings merely provide examples, and are not intended to limit interpretation of the invention. The same element as that described in the drawing already discussed is denoted by the same reference numeral throughout the description and the drawings, and detailed description thereof will not be repeated in some cases.

Figure 2:
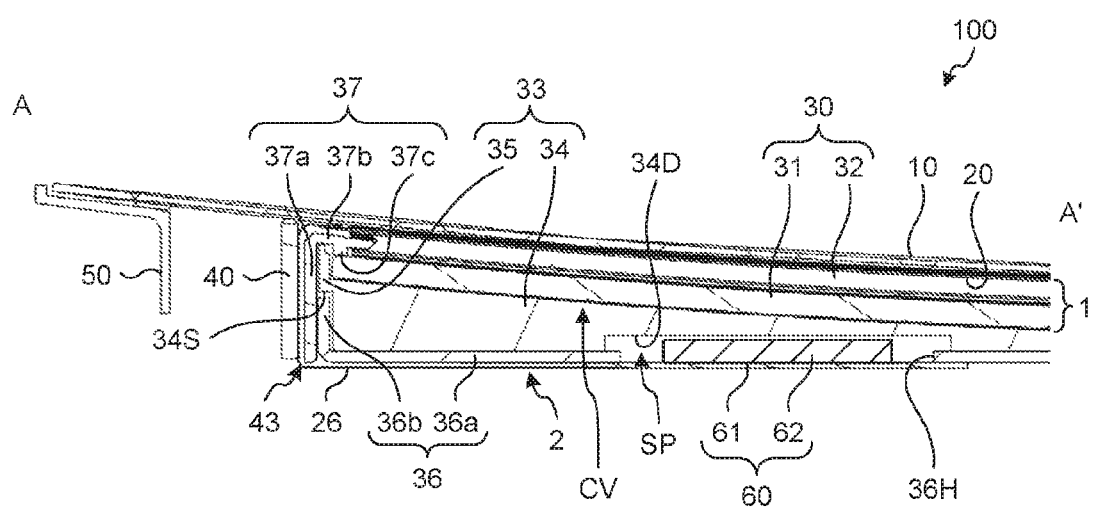
FIG. 2 is a sectional view along the line A-A' in FIG. 1.
Figure 3:
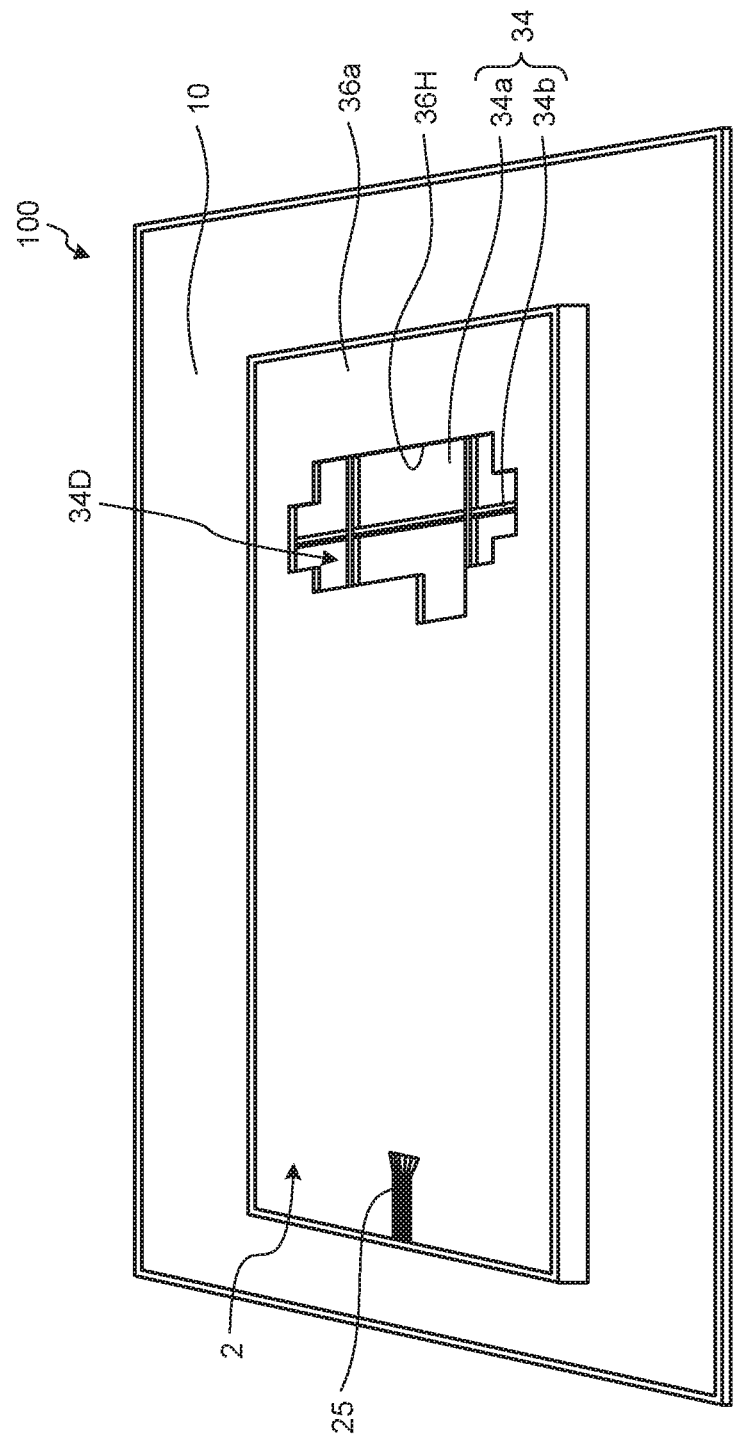
FIG. 3 is a diagram illustrating a state before a printed circuit board is fixed to a lower surface of a case.
Figure 4:
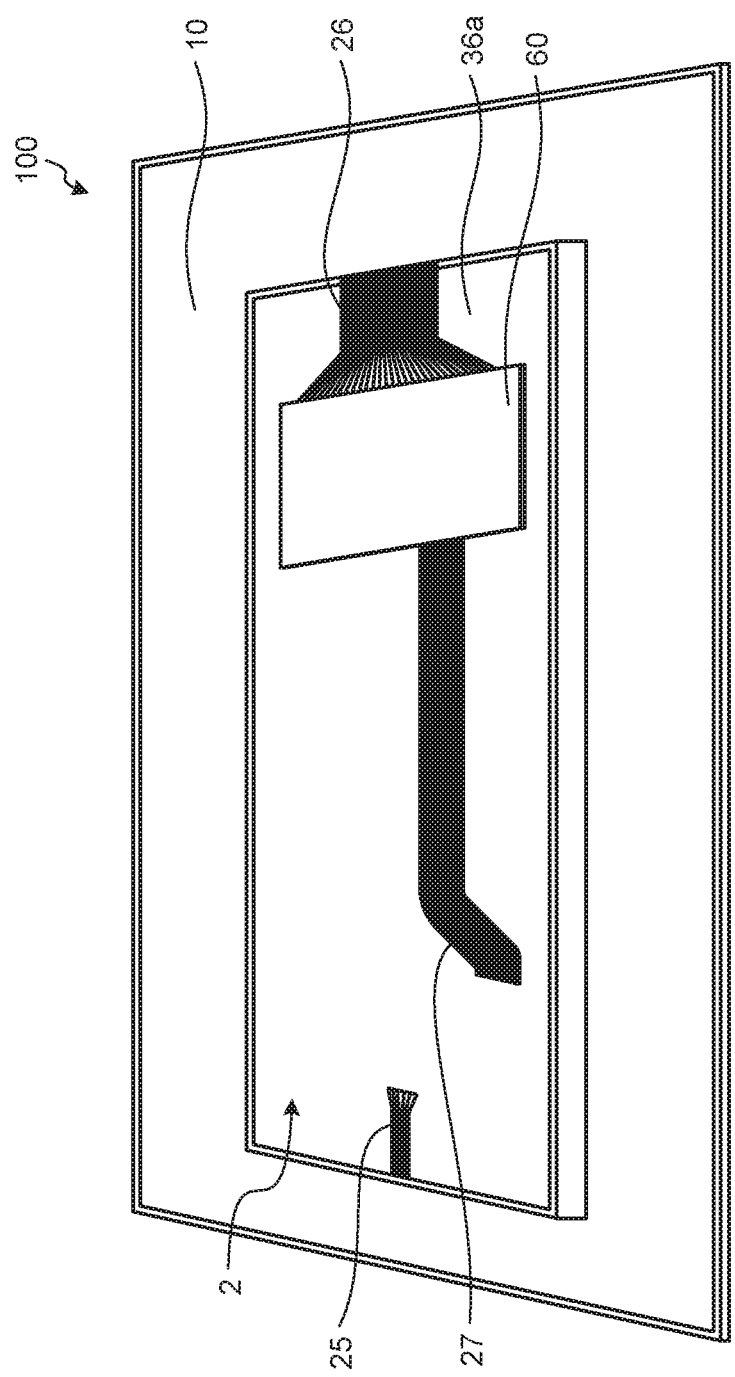
FIG. 4 is a diagram illustrating a state after the printed circuit board is fixed to the lower surface of the case.

FIG. 1 is a plan view of a display device 100 according to an embodiment viewed from an upper surface side thereof. FIG. 2 is a sectional view along the line A-A' in FIG. 1. FIGS. 3 and 4 are diagrams illustrating a configuration on a lower surface side of a case 2. FIG. 3 is a diagram illustrating a state before a printed circuit board 60 is fixed to the lower surface of the case 2. FIG. 4 is a diagram illustrating a state after the printed circuit board 60 is fixed to the lower surface of the case 2. The following describes a configuration of each member assuming that a side from which an image is observed by a user is an "upper side", and a side opposite to the side from which the image is observed by the user is a "lower side".

As illustrated in FIGS. 1 and 2, the display device 100 includes a display body 1, the case 2, a covering member 10, a support base 33, and a reinforcing frame 50. The display body 1 includes, for example, a display panel 20 and a backlight 30. The display panel 20 is, for example, a liquid crystal panel. The printed circuit board 60 is electrically coupled to the display panel 20 through a flexible printed circuit board (hereinafter, abbreviated as an FPC) 26. The backlight 30 includes, for example, a light guide plate 31, an optical sheet part 32, and a light source (not illustrated). The optical sheet part 32 includes, for example, a plurality of optical sheets such as a prism sheet and a diffusion sheet.

The covering member 10 is bonded to an upper surface of the display panel 20. The covering member 10 is, for example, a transparent substrate that transmits visible light such as a glass substrate or a plastic substrate. The covering member 10 includes a frame-shaped light shielding layer 11 that edges a display region 1A of the display body 1. An image displayed in the display region 1A is visually recognized by an observer through the covering member 10. An outer edge of the covering member 10 is supported by the reinforcing frame 50. When the display device 100 is mounted on a plate of another device, the reinforcing frame 50 is sandwiched between the plate and the covering member 10 to suppress vibration of the covering member 10.

A curved part that is curved toward the case 2 side is arranged at a center part of the covering member 10. The display body 1 is bonded to a lower surface of the covering member 10 while being curved along the curved part. The display body 1 includes a curved part CV reflecting the curved shape of the covering member 10. The covering member 10 protects the display panel 20 and keeps the display panel 20 in the curved shape. A member constituting the display panel 20 is thinned to easily follow the curved shape of the covering member 10. For example, the thickness of a substrate constituting the display panel 20 is 50 μm to 200 μm.

The case 2 includes a first frame 36, a second frame 37, a third frame 40, and the support base 33. The first frame 36 includes a first frame body 36b and a bottom plate part 36a. The bottom plate part 36a is arranged so as to be opposed to a lower surface of the display body 1. The first frame body 36b projects toward the display body 1 from an outer edge of the bottom plate part 36a.

The support base 33 supporting the display body 1 is arranged between the first frame 36 and the display body 1. The support base 33 includes a main body 34 and a side surface cover 35. The main body 34 is sandwiched between the display body 1 and the bottom plate part 36a, and supports the lower surface of the display body 1. The side surface cover 35 projects toward the covering member 10 side from an outer edge of an upper surface of the main body 34 to surround an outer circumference of the backlight 30. The backlight 30 is fitted into the support base 33 along an inner wall surface of the side surface cover 35.

An indentation 34S having a depth almost the same as the thickness of the first frame body 36b is provided in a side surface of the main body 34 opposed to the first frame body 36b. A lower end of a part of the support base 33 in which the indentation 34S is provided is fitted into the first frame 36 along an inner wall surface of the first frame body 36b. An upper end of the support base 33 having the side surface cover 35 provided thereon is arranged in such a manner as to run on an upper part of the first frame body 36b.

The second frame 37 includes a second frame body 37a, an edge cover 37b, and a projection part 37c. The second frame body 37a surrounds an outer circumference of the first frame body 36b, and is fixed to a side surface of the first frame body 36b. The edge cover 37b projects toward the display body 1 side from an upper end of the second frame body 37a so as to be opposed to an edge of an upper surface of the backlight 30. The projection part 37c projects toward the backlight 30 side from a lower surface of the edge cover 37b to be in contact with an upper surface of the light guide plate 31. An outer edge of the display panel 20 is in contact with an upper surface of the edge cover 37b. An outer edge of the optical sheet part 32 and an upper end of the side surface cover 35 are in contact with a lower surface of the edge cover 37b.

The first frame 36 is fitted into the second frame 37 along an inner wall surface of the second frame body 37a. The first frame 36 is fixed to the second frame 37 with a screw (not illustrated), for example. A center part of the backlight 30 is exposed from the edge cover 37b. The display panel 20 is irradiated with light emitted from the center part of the backlight 30. The display panel 20 modulates the light emitted from the backlight 30 to form an image.

The third frame 40 is bonded to the covering member 10 while surrounding an outer circumference of the second frame body 37a. A gap 43 is provided between the third frame 40 and the second frame body 37a. A first end of the FPC 26 is electrically coupled to the display panel 20. A second end of the FPC 26 is drawn out to a lower surface side of the bottom plate part 36a through the gap 43. The printed circuit board 60 is electrically coupled to the second end of the FPC 26. The printed circuit board 60 is fixed to the lower surface of the bottom plate part 36a with a screw and the like.

As illustrated in FIG. 3, a through hole 36H is provided through the bottom plate part 36a at a position opposed to the curved part CV. As illustrated in FIG. 2, the printed circuit board 60 includes a substrate body 61 and an electronic component 62. The electronic component 62 is mounted on a surface of the printed circuit board 60 opposed to the bottom plate part 36a. As illustrated in FIGS. 2 and 4, the printed circuit board 60 is fixed to a surface of the bottom plate part 36a opposite to the display body 1 side with the electronic component 62 arranged inside the through hole 36H. The electronic component 62 is, for example, arranged in a space SP formed between the bottom plate part 36a and the display body 1 through the through hole 36H.

The space SP is, for example, formed by an indentation 34D provided in a surface of the support base 33 opposed to the bottom plate part 36a. The space SP formed between the surface in which the indentation 34D is provided and the bottom plate part 36a is the space for housing the electronic component 62.

For example, as illustrated in FIG. 3, the main body 34 includes a top board 34a supporting the display body 1 and a plurality of wall members 34b projecting from the top board 34a toward the bottom plate part 36a side. A space surrounded by the top board 34a and the wall members 34b is the space SP for housing the electronic component 62. The wall members 34b are, for example, arranged in a grid-like fashion on the entire surface of the top board 34a on the bottom plate part 36a side, but the arrangement of the wall members 34b is not limited thereto. For example, the wall members 34b may be arranged in stripes on the entire surface of the top board 34a on the bottom plate part 36a side. The side surface cover 35 illustrated in FIG. 2 is arranged on an outer edge of an upper surface of the top board 34a.

As illustrated in FIGS. 3 and 4, an end of an FPC 25 that is electrically coupled to the backlight 30 is drawn out to a lower surface side of the bottom plate part 36a. An FPC 27 is electrically coupled to the printed circuit board 60. The end of the FPC 25 and an end of the FPC 27 are each fixed to the lower surface of the bottom plate part 36a with adhesive tape or the like. The display device 100 is shipped with the FPC 25 and the FPC 27 fixed to the lower surface of the bottom plate part 36a with adhesive tape.

In the display device 100 according to the present embodiment described above, the through hole 36H for housing the electronic component 62 is arranged on the bottom plate part 36a of the case 2. Thus, the height of the electronic component 62 projecting toward the lower surface side of the bottom plate part 36a is reduced, which reduces the thickness of the display device 100. When the display body 1 including the curved part CV is housed in the case 2, a gap is formed between the display body 1 and the bottom plate part 36a of the case 2. Accordingly, when the electronic component 62 is housed in the gap, the height of the electronic component 62 projecting toward the lower surface side of the bottom plate part 36a is considerably reduced.

The preferred embodiment of the present invention has been described above. However, the present invention is not limited thereto. Content disclosed in the embodiment is merely an example, and various modifications can be made without departing from the gist of the invention. The present invention naturally encompasses an appropriate modification maintaining the gist of the invention. The present invention also encompasses any invention that can be implemented by those skilled in the art by appropriately modifying design of the invention described above while maintaining the gist of the invention.

Figure 5:
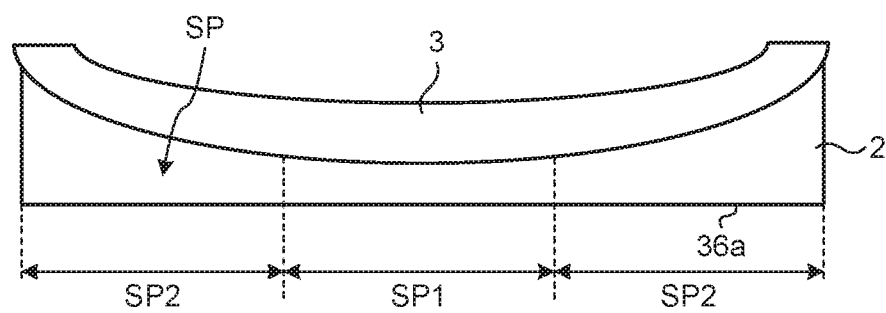
FIG. 5 is a diagram illustrating a variation of a curved shape of a display body.
Figure 6:
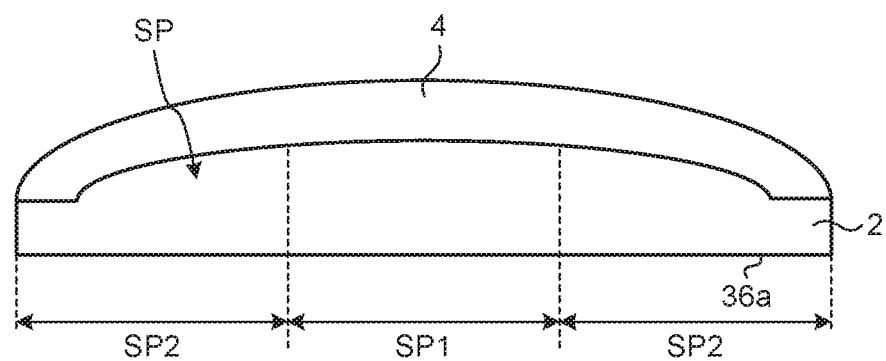
FIG. 6 is a diagram illustrating a variation of the curved shape of the display body.

For example, the above embodiment exemplifies a case in which the display body 1 is curved toward the bottom plate part 36a side, but the shape of the display body 1 is not limited thereto. FIGS. 5 and 6 are diagrams illustrating variations of the curved shape of the display body. In the example of FIG. 5, similarly to the display body 1 illustrated in FIG. 2, a display body 3 is curved toward the bottom plate part 36a side. In the example of FIG. 6, a display body 4 is curved toward a side opposite to the bottom plate part 36a side. The through hole of the bottom plate part 36a is formed at an appropriate position corresponding to the curved shape of the display body 1.

For example, the through hole of the bottom plate part 36a is preferably arranged at a position different from a position at which a distance between the display body and the bottom plate part 36a is the smallest. When the through hole is formed at such a position, the space SP having a sufficient height for inserting the electronic component 62 (refer to FIG. 2) is secured above the through hole. For example, in the example of FIG. 5, the through hole is formed in a region SP2 opposed to an outer edge of the display body 3. In the example of FIG. 6, the through hole is formed in a region SP1 opposed to a center part of the display body 1. Accordingly, a thin display device is provided in which the space SP between the display body and the bottom plate part 36a is effectively utilized.

The above embodiment exemplifies a liquid crystal display device including the liquid crystal panel and the backlight as the display body 1, but the display body 1 is not limited thereto. For example, an organic electro-luminescence display (OLED) device or an electrophoretic display (EPD) device may be used as the display body 1.

What is claimed is:

1. A display device comprising:
   a display body including a curved part;
   a case including a bottom plate part through which a through hole is provided at a position opposed to the curved part; and
   a printed circuit board that is fixed to a surface of the bottom plate part opposite to the display body side with an electronic component mounted on a surface of the printed circuit board opposed to the bottom plate part and with the electronic component arranged inside the through hole.

2. The display device according to claim 1, wherein the through hole is arranged at a position different from a position at which a distance between the display body and the bottom plate part is the smallest.

3. The display device according to claim 1, wherein the electronic component is arranged in a space formed between the bottom plate part and the display body through the through hole.

4. The display device according to claim 3, wherein
   a support base supporting the display body is arranged between the bottom plate part and the display body,
   an indentation is provided in a surface of the support base opposed to the bottom plate, and
   a space formed between the surface in which the indentation is provided and the bottom plate part is the space for housing the electronic component.

5. The display device according to claim 4, wherein
   the support base includes a top board supporting the display body and a plurality of wall members projecting from the top board toward the bottom plate part side, and
   a space surrounded by the top board and the wall members is the space for housing the electronic component.

* * * * *